(12) United States Patent
Murase et al.

(10) Patent No.: US 9,240,383 B2
(45) Date of Patent: Jan. 19, 2016

(54) HIGH FREQUENCY SWITCH MODULE

(71) Applicant: Murata Manufacturing Co., Ltd., Nagaokakyo-shi, Kyoto-fu (JP)

(72) Inventors: Hisanori Murase, Nagaokakyo (JP); Takanori Uejima, Nagaokakyo (JP); Muneyoshi Yamamoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/449,242

(22) Filed: Aug. 1, 2014

(65) Prior Publication Data

US 2014/0339689 A1 Nov. 20, 2014

Related U.S. Application Data

(63) Continuation of application No. PCT/JP2013/052986, filed on Feb. 8, 2013.

(30) Foreign Application Priority Data

Feb. 21, 2012 (JP) ................................ 2012-034712

(51) Int. Cl.
*H01L 29/93* (2006.01)
*H01L 23/66* (2006.01)
*H04B 1/48* (2006.01)
(Continued)

(52) U.S. Cl.
CPC ............ *H01L 23/66* (2013.01); *H01L 23/5226* (2013.01); *H01L 23/5286* (2013.01); *H01L 27/0207* (2013.01); *H04B 1/48* (2013.01); *H01L 2924/15174* (2013.01)

(58) Field of Classification Search
CPC . H01L 23/5226; H01L 23/5286; H01L 23/66; H01L 27/0207; H01L 2924/15174; H01L 21/70; H01L 21/823475; H01L 2223/6672; H01L 28/75; H01L 31/0475
USPC .................. 257/676, 690–693, 700–703, 773
See application file for complete search history.

(56) References Cited

U.S. PATENT DOCUMENTS

2005/0077978 A1 4/2005 Kizuki et al.
2010/0062727 A1 3/2010 Kemmochi et al.
(Continued)

FOREIGN PATENT DOCUMENTS

EP 2 352 229 A1 8/2011
JP 06-275973 A 9/1994
(Continued)

OTHER PUBLICATIONS

Official Communication issued in International Patent Application No. PCT/JP2013/052986, mailed on Mar. 12, 2013.

*Primary Examiner* — H Tsai
(74) *Attorney, Agent, or Firm* — Keating & Bennett, LLP

(57) ABSTRACT

A high frequency switch module includes a multilayer substrate and a switch IC. The switch IC is mounted on a top plane of the multilayer substrate. A drive power signal input port and control signal input ports are connected to direct current external input ports through direct current voltage conductors, respectively. In-layer conductors of the direct current voltage conductors are arranged so that the in-layer conductors overlap each other at least partially in a state in which the multilayer substrate is viewed along a stacking direction.

14 Claims, 6 Drawing Sheets

(51) Int. Cl.
*H01L 23/522* (2006.01)
*H01L 23/528* (2006.01)
*H01L 27/02* (2006.01)

(56) References Cited

U.S. PATENT DOCUMENTS

2010/0123228 A1* 5/2010 Bartlow ............... H01L 23/047
　　　　　　　　　　　　　　　　　　　　257/676
2011/0234295 A1 9/2011 Uejima et al.

FOREIGN PATENT DOCUMENTS

| JP | 2005-117467 A | 4/2005 |
| JP | 2006-203470 A | 8/2006 |
| JP | 2007-266840 A | 10/2007 |
| JP | 2008-085775 A | 4/2008 |
| JP | 2011-035940 A | 2/2011 |
| JP | 2011-077723 A | 4/2011 |
| WO | 2010/053131 A1 | 5/2010 |

* cited by examiner

HIGH FREQUENCY SWITCH MODULE

BACKGROUND OF THE INVENTION

1. Field of the Invention

The present invention relates to a high frequency switch module that transmits and receives different kinds of communication signals, the number of which is equal to or higher than the number of antennas to be connected by a switch IC, and in particular, to a high frequency switch module including a multilayer substrate on which a switch IC is mounted.

2. Description of the Related Art

Conventionally, a variety of down-sized and multiband-compatible high frequency switch modules such as a configuration illustrated in Japanese Unexamined Patent Application Publication No. 2008-85775 have been designed for use in communication terminals. Typically, such a high frequency switch module includes a multilayer substrate in which conductors defining a circuit of the high frequency switch module are provided and a switch IC that is mounted on a top surface of the multilayer substrate.

The switch IC includes a common port and a plurality of switching ports, selects one of the plurality of switching ports, and connects a selected one to the common port. The switch IC is activated by applying a drive power signal (for example, a predetermined voltage Vd) from outside. The connection among the common port and the plurality of switching ports is selected depending on a combination of voltage levels of plural control signals (for example, three voltage types of the control signals, Vc1, Vc2, and Vc3). Since the switch IC is mounted on the top surface of the multilayer substrate, the conductors that supply the drive power signal and the control signals to the switch IC are provided inside the multilayer substrate. Further, these conductors are connected to lands on which the switch IC is mounted.

Further, conductors configured to transmit communication signals are provided inside the multilayer substrate.

However, in a conventional structure illustrated in Japanese Unexamined Patent Application Publication No. 2008-85775, the conductors for switch control, which transmit the drive power signal and the control signals (conductors transmitting direct voltages), tend to be arranged close to the conductors transmitting communication signals (conductors transmitting high frequency signals) if the multilayer substrate is to be reduced in size. When the conductors for switch control and the conductors transmitting communication signals are arranged close to each other, mutual interference tends to occur between the communication signal and the drive power signal or the control signals. For example, shortcomings, such as superimpositions of direct current voltages on the communication signals due to the drive power signal or the control signals or inverse superimpositions of high frequency noise on the drive power signal or the control signals due to the communication signals, tend to occur.

SUMMARY OF THE INVENTION

Preferred embodiments of the present invention provide a high frequency switch module in which mutual interference is unlikely to occur between the communication signal and the drive power signal or the control signals.

Preferred embodiments of the present invention provide a high frequency switch module including a switch IC and a multilayer substrate. The switch IC includes a common port to and from which a high frequency signal is inputted and outputted; a plurality of switching ports, the number of which is higher than that of the common port, each switching port being a port to and from which the high frequency signal is inputted and outputted; a drive power supply port to which a drive power signal is inputted; and a plurality of control ports to which control signals are inputted, the control signals being signals for determining a connection state between the common port and the plurality of switching ports. The switch IC is mounted on the multilayer substrate. On the multilayer substrate, a high frequency transmission conductor that transmits the high frequency signal and a plurality of direct current voltage conductors through which the drive power signal and the control signals are transmitted respectively are provided. The multilayer substrate includes a plurality of direct current external input ports to which the drive power signal and the control signals are inputted respectively and a plurality of high frequency external input-output ports, each being a port to and from which the high frequency signal is inputted and outputted. The plurality of direct current voltage conductors are all arranged so that in-layer conductors of the direct current voltage conductors overlap each other at least partially, the in-layer conductor are routed inside a plane perpendicular or substantially perpendicular to a stacking direction of the direct current voltage conductors.

With this configuration, formation areas of the plurality of direct current voltage conductors inside planes, which expand in a direction perpendicular or substantially perpendicular to the stacking direction, overlap each other. Thus, wider formation areas are provided for the high frequency transmission conductors. This enables the high frequency transmission conductors to be separated from the direct current voltage conductors.

Preferably, the high frequency switch module according to a preferred embodiment of the present invention may have the following configuration. First partial conductors of the plurality of direct current voltage conductors on a connecting side to the drive power supply port and the plurality of control ports of the switch IC preferably are arranged to be concentrated at a first fork in a state in which the multilayer substrate is viewed in a direction parallel to the stacking direction. The in-layer conductors of the plurality of direct current voltage conductors between the first fork and the direct current external input ports of the multilayer substrate preferably are arranged so that the in-layer conductors overlap each other at least partially along the multilayer substrate.

With this configuration, only predetermined portions of the direct current voltage conductors up to the first fork on the connecting side to the switch IC expand in planes perpendicular or substantially perpendicular to the stacking direction whereas portions of the direct current voltage conductors beyond the first fork overlap each other in the stacking direction. These portions of the direct current voltage conductors beyond the first fork are configured so as to include a majority of routing patterns configured to transmit the drive power signal and the control signals. This enables wiring areas of the direct current voltage conductors to be reduced into smaller areas more effectively.

Preferably, the high frequency switch module of a preferred embodiment of the present invention may have the following configuration. Second partial conductors of the plurality of direct current voltage conductors on a connecting side to the direct current external input ports of the multilayer substrate preferably are arranged to be concentrated at a second fork in the state in which the multilayer substrate is viewed in a direction parallel to the stacking direction, the second fork being separated from the first fork. The in-layer conductors of the plurality of direct current voltage conductors between the first fork and the second fork preferably are arranged so that all of the in-layer conductors overlap each other along the multilayer substrate.

With this configuration, only predetermined portions of the direct current voltage conductors up to the second fork on the side toward the direct current external input ports of the multilayer substrate expand in planes perpendicular or substantially perpendicular to the stacking direction whereas the direct current voltage conductors between the first fork and the second fork overlap each other in the stacking direction. The direct current voltage conductors between the first fork and the second fork are configured so as to occupy a majority of routing patterns configured to transmit the drive power signal and the control signals. This enables wiring areas of the direct current voltage conductors to be reduced into smaller areas more effectively.

Preferably, in the high frequency switch module according to a preferred embodiment of the present invention, the in-layer conductors defining each one of the plurality of direct current voltage conductors preferably are provided in adjacent insulation layers of a plurality of insulation layers that define the multilayer substrate respectively.

This configuration enables the formation areas of the plurality of direct current voltage conductors to be down-sized even in the stacking direction (thickness direction of the multilayer substrate).

Preferably, the high frequency switch module according to a preferred embodiment of the present invention may have the following configuration. A chassis of the switch IC and a chassis of the multilayer substrate may have rectangular or substantially rectangular shapes. The drive power supply port and the plurality of control ports of the switch IC preferably are arranged near and along a first side of the chassis of the switch IC. The plurality of direct current external input ports of the multilayer substrate preferably are arranged near and along a second side of the chassis of the multilayer substrate. The switch IC preferably are mounted on the multilayer substrate so that the first side of the switch IC and the second side of the multilayer substrate are parallel or substantially parallel to each other and the second side is closer to the first side than other sides of the multilayer substrate.

With this configuration, the distances from the direct current external input ports of the multilayer substrate to the drive power supply port and the plurality of control ports of the switch IC is reduced. Using the foregoing configuration in which the direct current voltage conductors overlap each other enables the routing patterns configured to transmit the drive power signal and the control signals to be effectively achieved even in a narrow space between the direct current external input ports of the multilayer substrate and the drive power supply port and the plurality of control signals of the switch IC. Further, this enables separation of the routing patterns configured to transmit the drive power signal and the control signals from the high frequency transmission conductors that connect the common port and the plurality of switching ports provided on another side (side other than the first side) of the switch IC and the plurality of high frequency external input-output ports provided on another side (side other than the second side) of the multilayer substrate, respectively. Further, this enables wider formation areas of the high frequency transmission conductors, thus making it possible to improve flexibility in routing the high frequency transmission conductors.

According to various preferred embodiments of the present invention, transmission paths of the drive power signal and the control signals and transmission paths of the communication signals preferably are separated by greater distances than those in the conventional configuration. Thus, the mutual interference between the communication signals and the drive power signal or the control signals is significantly reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
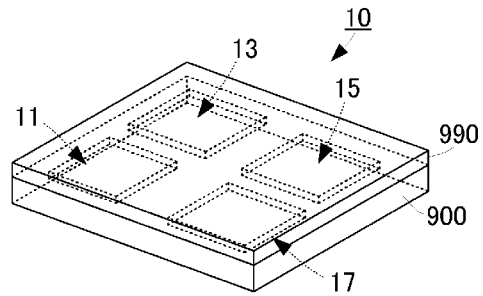
FIG. 1 is an external perspective view of a high frequency switch module 10 according to a first preferred embodiment of the present invention.
Figure 2A:
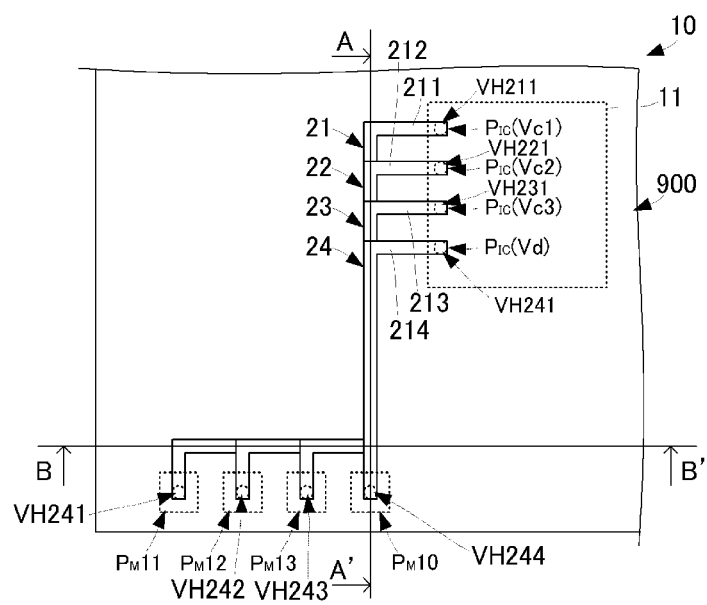
FIG. 2A to FIG. 2C are diagrams illustrating wiring pattern concepts of the high frequency switch module 10 according to the first preferred embodiment of the present invention.
Figure 2B:
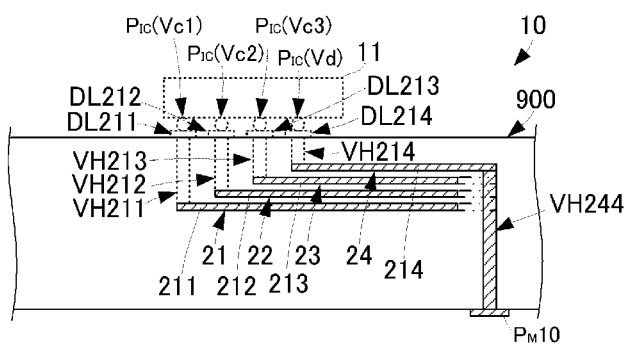
Figure 2C:
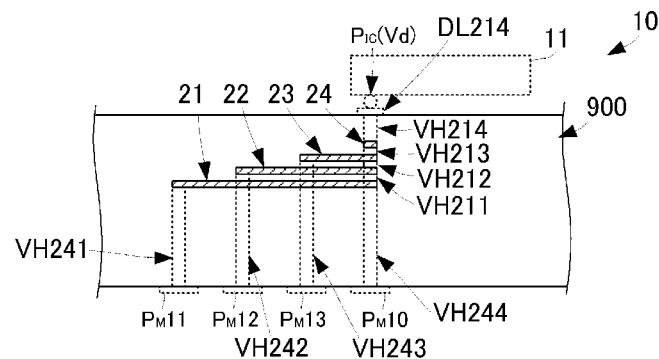

A high frequency switch module according to preferred embodiments of the present invention is described with reference to the drawings. FIG. 1 is an external view of a high frequency switch module 10 according to a first preferred embodiment of the present invention. FIGS. 2A-2C includes diagrams illustrating wiring pattern concepts of the high frequency switch module 10 according to the first preferred embodiment. FIG. 2A is a transparent plan view, FIG. 2B is an A-A' cross-sectional diagram of FIG. 2A, and FIG. 2C is a B-B' cross-sectional diagram of FIG. 2A.

The high frequency switch module 10 includes a multilayer substrate 900, a switch IC 11, SAW duplexers 13, 15, and 17, and an insulating resin 990. Note that although not illustrated in FIG. 1, other circuit elements of the high frequency switch module 10 such as, for example, inductors and SAW filters are also mounted on the multilayer substrate 900.

The multilayer substrate 900 includes a plurality of insulation layers that are stacked on top of each other. In the multilayer substrate 900, conductors of a circuit configuration of the high frequency switch module 10 are provided. The conductors provided in the multilayer substrate 900 include in-layer conductors, top-plane conductors, and bottom-plane conductors. Connecting these conductors into a desired connection state enables the configuration a circuit of the high frequency switch module 10, except mount components, such as the switch IC 11 and the SAW duplexers 13, 15, and 17, for example. The in-layer conductor is disposed between insulation layers of the multilayer substrate 900. The top-plane conductor is provided on the top plane (mounting plane of the respective mount components) of the multilayer substrate 900. The top-plane conductor is a land electrode primarily provided to mount the mount component thereon. The bottom-plane conductor is provided on the bottom plane of the multilayer substrate 900, such as a plane to be mounted on another circuit board when the multilayer substrate 900 is mounted thereon. The bottom-plane conductor includes an external mount land electrode configured to mount the multilayer substrate 900 on another circuit board.

Mount-type devices such as the switch IC 11, the SAW duplexers 13, 15, and 17, and other suitable devices are mounted on the top plane of the multilayer substrate 900. When mounting the mount-type devices, each mount-type device is mounted on a predetermined land electrode according to a circuit pattern of the high frequency switch module 10. According to the configuration described above, the high frequency switch module 10 is a module that includes the multilayer substrate 900. Note that the insulating resin 990 is preferably provided on a surface of the multilayer substrate 900 so as to cover the respective mount-type devices. However, it is possible to omit this insulating resin 990.

The conductors of the high frequency switch module 10 include high frequency transmission conductors and direct current voltage conductors. The high frequency transmission conductors are conductors configured to transmit transmission signals or reception signals of the respective communication signals. The direct current voltage conductors are conductors configured to transmit the drive power signal and the control signals for the switch IC 11.

Specifically, the direct current voltage conductors are configured in shapes as illustrated in FIGS. 2A to 2C.

First, the switch IC 11 has a rectangular or substantially rectangular shape. On the bottom side of the switch IC 11, a drive power signal input port PIC(Vd) and control signal input ports $P_{IC}(Vc1)$, $P_{IC}(Vc2)$, and $P_{IC}(Vc3)$ are provided so as to be arranged along one side of the switch IC 11 at a predetermined interval in planar view. For example, as illustrated in FIGS. 2A to 2C, the drive power signal input port $P_{IC}(Vd)$, the control signal input port $P_{IC}(Vc3)$, the control signal input port $P_{IC}(Vc2)$, and the control signal input port $P_{IC}(Vc1)$ are provided and arranged in that order.

To mount the foregoing switch IC 11, mount lands DL211, DL212, DL213, and DL214 are provided at predetermined locations on the top plane of the multilayer substrate 900.

On the mount land DL214, the drive power signal input port $P_{IC}(Vd)$ is mounted. On the mount land DL211, the control signal input port $P_{IC}(Vc1)$ is mounted. On the mount land DL212, the control signal input port $P_{IC}(Vc2)$ is mounted. On the mount land DL213, the control signal input port $P_{IC}(Vc3)$ is mounted.

A conductive via-hole VH214 that has a first depth (height) in a stacking direction of the multilayer substrate 900 is provided in a formation area of the mount land DL214 in the multilayer substrate 900.

A conductive via-hole VH213 that has a second depth (height) in the stacking direction of the multilayer substrate 900 is provided in a formation area of the mount land DL213 in the multilayer substrate 900. The conductive via-hole VH213 extends deeper than the conductive via-hole VH214. Specifically, for example, the conductive via-hole VH213 extends deeper than the conductive via-hole VH214 by the thickness of single insulation layer of the multilayer substrate 900.

A conductive via-hole VH212 that has a third depth (height) in the stacking direction of the multilayer substrate 900 is provided in a formation area of the mount land DL212 in the multilayer substrate 900. The conductive via-hole VH212 extends deeper than the conductive via-hole VH213. Specifically, for example, the conductive via-hole VH212 extends deeper than the conductive via-hole VH213 by the thickness of single insulation layer of the multilayer substrate 900.

A conductive via-hole VH211 that has a fourth depth (height) in the stacking direction of the multilayer substrate 900 is provided in a formation area of the mount land DL211 in the multilayer substrate 900. The conductive via-hole VH211 extends deeper than the conductive via-hole VH212. Specifically, for example, the conductive via-hole VH211 extends deeper than the conductive via-hole VH212 by the thickness of single insulation layer of the multilayer substrate 900.

An end portion of the conductive via-hole VH214 on the side opposite to the mount land DL214 is connected to one end of the in-layer conductor 214. When viewed from a direction parallel to the stacking direction of the multilayer substrate 900, the in-layer conductor 214 extends for a predetermined length in a direction perpendicular or substantially perpendicular to a side along which the drive power signal input port $P_{IC}(Vd)$ and the control signal input ports $P_{IC}(Vc1)$, $P_{IC}(Vc2)$, and $P_{IC}(Vc3)$ are provided (hereinafter, simply referred to as "direct current voltage input side"), and from there extends for a predetermined length in a direction parallel or substantially parallel to the direct current voltage input side. That is, the in-layer conductor 214 preferably has an "L" shape.

An end portion of the conductive via-hole VH213 on the side opposite to the mount land DL213 is connected to one end of the in-layer conductor 213. When viewed from the direction parallel to the stacking direction of the multilayer substrate 900, the in-layer conductor 213 extends for a predetermined length in the direction perpendicular or substantially perpendicular to the direct current voltage input side, and from there extends for a predetermined length in the direction parallel or substantially parallel to the direct current voltage input side. That is, the in-layer conductor 213 preferably has an "L" shape. The in-layer conductor 213 is provided on an insulation layer that is one layer below the in-layer conductor 214. This insulation layer is one of the insulation layers of the multilayer substrate 900.

An end portion of the conductive via-hole VH212 on the side opposite to the mount land DL212 is connected to one end of the in-layer conductor 212. When viewed from the direction parallel to the stacking direction of the multilayer substrate 900, the in-layer conductor 212 extends for a predetermined length in the direction perpendicular or substantially perpendicular to the direct current voltage input side, and from there extends for a predetermined length in the direction parallel or substantially parallel to the direct current voltage input side. That is, the in-layer conductor 212 preferably has an "L" shape. The in-layer conductor 212 is provided on an insulation layer that is one layer below the in-layer conductor 213. This insulation layer is one of the insulation layers of the multilayer substrate 900.

An end portion of the conductive via-hole VH211 on the side opposite to the mount land DL211 is connected to one end of the in-layer conductor 211. When being viewed from the direction parallel to the stacking direction of the multilayer substrate 900, the in-layer conductor 211 extends for a predetermined length in the direction perpendicular or substantially perpendicular to the direct current voltage input side, and from there extends for a predetermined length in the direction parallel or substantially parallel to the direct current voltage input side. That is, the in-layer conductor 211 preferably has an "L" shape. The in-layer conductor 211 is provided on an insulation layer that is one layer below the in-layer conductor 212. This insulation layer is one of the insulation layers of the multilayer substrate 900.

The lengths of portions of the in-layer conductors 211, 212, 213, and 214 that extend in the direction perpendicular or substantially perpendicular to the direct current voltage input side are equal or substantially equal to each other.

The foregoing configuration enables the portions of the in-layer conductors 211, 212, 213, and 214 extending in the direction parallel or substantially parallel to the direct current voltage input side to overlap each other in the stacking direction of the multilayer substrate 900.

A plurality of direct current external input ports $P_M10$, $P_M11$, $P_M12$, and $P_M13$ is provided near and along a side perpendicular or substantially perpendicular to the direct current voltage input side in the bottom plane of the multilayer substrate 900. Specifically, for example, as illustrated in FIGS. 2A to 2C, the direct current external input port $P_M10$, the direct current external input port $P_M13$, the direct current external input port $P_M12$, and the direct current external input port $P_M11$ are provided and arranged in that order at a predetermined interval from a side closer to a mount location of the switch IC 11 when the multilayer substrate 900 is viewed in plan view.

An end portion of the in-layer conductor 214 on the side opposite to the conductive via-hole VH214 is connected to the direct current external input port $P_M10$ through the conductive via-hole VH244. An end portion of the in-layer conductor 211 on the side opposite to the conductive via-hole VH211 is connected to the direct current external input port $P_M11$ through the conductive via-hole VH241. An end portion of the in-layer conductor 212 on the side opposite to the conductive via-hole VH212 is connected to the direct current external input port $P_M12$ through the conductive via-hole VH242. An end portion of the in-layer conductor 213 on the side opposite to the conductive via-hole VH213 is connected to the direct current external input port $P_M13$ through the conductive via-hole VH243.

The foregoing configuration enables the conductive via-hole VH214, the in-layer conductor 214, and the conductive via-hole VH244 to define a direct current voltage conductor 24 that supplies the drive power signal Vd to the switch IC 11. The conductive via-hole VH211, the in-layer conductor 211, and the conductive via-hole VH241 define a direct current voltage conductor 21 that supplies the control signal Vc1 to the switch IC 11. The conductive via-hole VH212, the in-layer conductor 212, and the conductive via-hole VH242 define a direct current voltage conductor 22 that supplies the control signal Vc2 to the switch IC 11. The conductive via-hole VH213, the in-layer conductor 213, and the conductive via-hole VH243 define a direct current voltage conductor 23 that supplies the control signal Vc3 to the switch IC 11.

Further, the foregoing configuration enables the in-layer conductor 211 of the direct current voltage conductor 21, the in-layer conductor 212 of the direct current voltage conductor 22, the in-layer conductor 213 of the direct current voltage conductor 23, and the in-layer conductor 214 of the direct current voltage conductor 24 to partially overlap each other in a state in which the multilayer substrate 900 is viewed in the stacking direction of the multilayer substrate 900.

This enables a group of the conductors (direct current voltage conductor group) configured to apply the drive power signal Vd and the control signals Vc1, Vc2, and Vc3 to the switch IC 11 to be arranged in planes viewed along the stacking direction of the multilayer substrate 900. This enables the reduction of a ratio of formation area of the direct current voltage conductor group to an area of the multilayer substrate 900 in planar view. Thus, flexibility in pattern designing of the high frequency transmission conductors (not illustrated in FIGS. 2A to 2C) that transmit high frequency signals (various communication signals) to the switch IC 11 is improved. Further, the direct current voltage conductors and the high frequency transmission conductors preferably are arranged so as to be separated from each other. This prevents shortcomings of the switch IC, such as malfunctions of the switch IC 11 due to superimpositions of high frequency signals on the drive power signal Vd or the control signals Vc1, Vc2, and Vc3 or shortcomings of the high frequency signal transmission system such as superimpositions of direct current components on high frequency signals due to the drive power signal Vd or the control signals Vc1, Vc2, and Vc3.

Further, a reduced ratio of formation area of the direct current voltage conductor group to the area of the multilayer substrate 900 in planar view increases an area available to mount the mount-type devices that transmit high frequency signals on the top plane of the multilayer substrate 900. This improves flexibility in designing an arrangement pattern of the mount-type devices.

Figure 3:
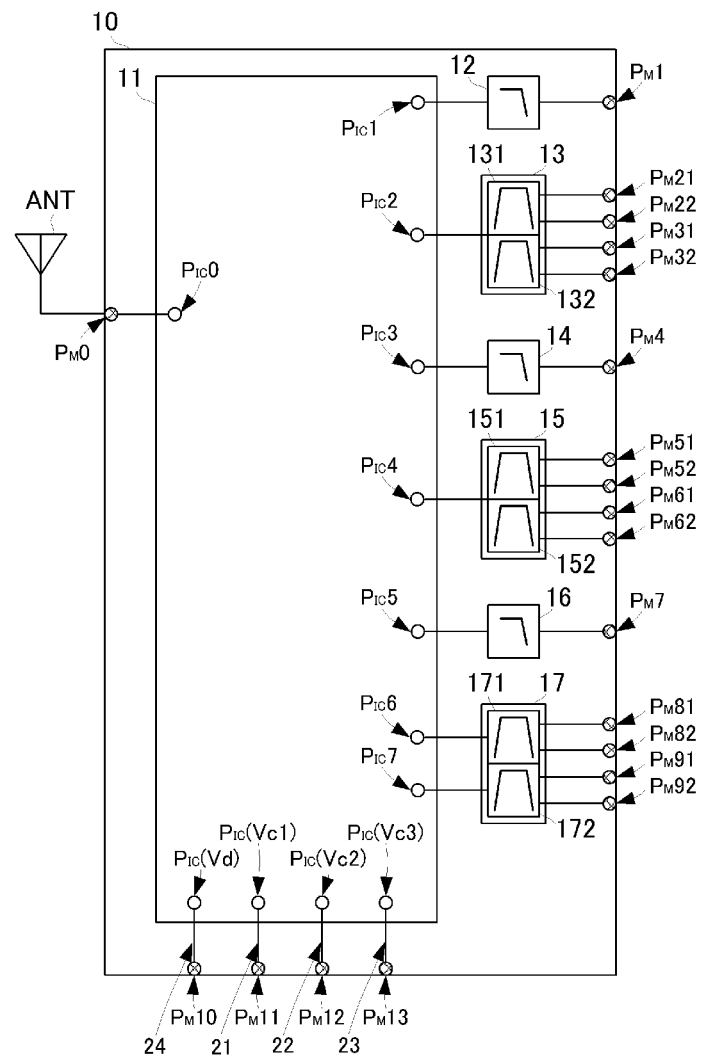
FIG. 3 is a circuit diagram illustrating a specific example of the high frequency switch module 10 according to the first preferred embodiment of the present invention.
Figure 4:
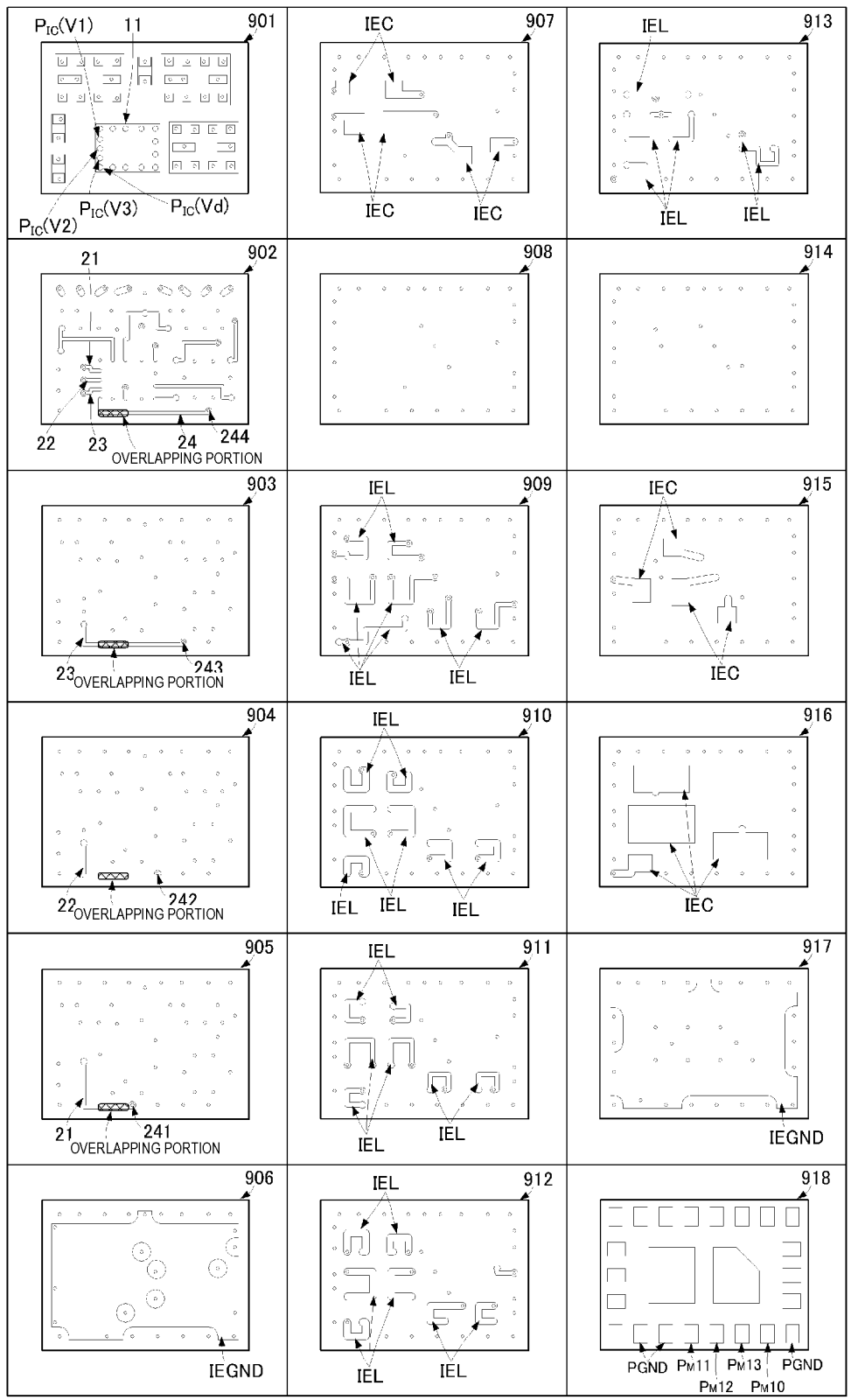
FIG. 4 is a stacking diagram illustrating a specific example of the high frequency switch module 10 according to the first preferred embodiment of the present invention.

Next, a circuit configuration and a stacking configuration of a specific high frequency switch module to which the foregoing configuration is applied is described with reference to FIG. 3 and FIG. 4. FIG. 3 is a circuit diagram illustrating a specific example of the high frequency switch module 10 according to the first preferred embodiment. FIG. 4 is a stacking diagram illustrating a specific example of the high frequency switch module 10 according to the first preferred embodiment.

First, referring to FIG. 3, the circuit configuration of the high frequency switch module 10 is described. The high frequency switch module 10 includes a switch IC 11, low-pass filters 12, 14, and 16, and SAW duplexers 13, 15, and 17. The high frequency switch module 10 includes the direct current external input ports $P_M10$, $P_M11$, $P_M12$, $P_M13$, and high frequency external input-output ports $P_M0$, $P_M1$, $P_M21$, $P_M22$, $P_M31$, $P_M32$, $P_M4$, $P_M51$, $P_M52$, $P_M61$, $P_M62$, $P_M7$, $P_M81$, $P_M82$, $P_M91$, and $P_M92$.

The switch IC 11 includes the drive power signal input port $P_{IC}(Vd)$, the control signal input ports $P_{IC}(Vc1)$, $P_{IC}(Vc2)$, and $P_{IC}(Vc3)$, a common port $P_{IC}0$, and a plurality of switching ports $P_{IC}1$, $P_{IC}2$, $P_{IC}3$, $P_{IC}4$, $P_{IC}5$, $P_{IC}6$, and $P_{IC}7$. The common port $P_{IC}0$ and the plurality of switching ports $P_{IC}1$, $P_{IC}2$, $P_{IC}3$, $P_{IC}4$, $P_{IC}5$, $P_{IC}6$, and $P_{IC}7$ are ports configured to input and output high frequency signals that define various communication signals.

The switch IC 11 is activated by the drive voltage of a predetermined level supplied from the drive power signal input port $P_{IC}(Vd)$, and connects the common port $P_{IC}0$ and one of the plurality of switching ports $P_{IC}1$, $P_{IC}2$, $P_{IC}3$, $P_{IC}4$, $P_{IC}5$, $P_{IC}6$, and $P_{IC}7$ according to a combination of voltage levels (Hi, Low) of the control signal input ports $P_{IC}(Vc1)$, $P_{IC}(Vc2)$, and $P_{IC}(Vc3)$.

The common port $P_{IC}0$ of the switch IC 11 is connected to the high frequency external input-output port $P_M0$ of the high frequency switch module 10, and the high frequency external input-output port $P_M0$ is connected to an antenna ANT.

The switching port $P_{IC}1$ of the switch IC 11 is connected to the high frequency external input-output port $P_M1$ of the high frequency switch module 10 through the low-pass filter 12. The high frequency external input-output port $P_M1$ is connected to a first transmitter circuit and receives one of a first transmission signal and a second transmission signal that differ in frequency. The low-pass filter 12 is a filter configured to significantly reduce or prevent harmonics of the first and second transmission signal.

The switching port $P_{IC}2$ of the switch IC 11 is connected to the balanced-type high frequency external input-output ports $P_M21$ and $P_M22$ of the high frequency switch module 10 through a SAW filter 131 of the SAW duplexer 13. The balanced-type high frequency external input-output ports $P_M21$ and $P_M22$ are connected to a first receiver circuit and output a first reception signal received at the antenna ANT. The SAW filter 131 of the SAW duplexer 13 is a filter that passes only a base frequency band of the first reception signal.

The switching port $P_{IC}2$ of the switch IC 11 is connected to the balanced-type high frequency external input-output ports $P_M31$ and $P_M32$ of the high frequency switch module 10 through a SAW filter 132 of the SAW duplexer 13. The balanced-type high frequency external input-output ports $P_M31$ and $P_M32$ are connected to a second receiver circuit and output a second reception signal received at the antenna ANT. The SAW filter 132 of the SAW duplexer 13 is a filter that passes only a base frequency band of the second reception signal.

The switching port $P_{IC}3$ of the switch IC 11 is connected to the high frequency external input-output port $P_M4$ of the high frequency switch module 10 through the low-pass filter 14. The high frequency external input-output port $P_M4$ is connected to a second transmitter circuit and receives one of a third transmission signal and a fourth transmission signal that differ in frequency. The low-pass filter 14 is a filter configured to significantly reduce or prevent harmonics of the third and fourth transmission signal.

The switching port $P_{IC}4$ of the switch IC 11 is connected to the balanced-type high frequency external input-output ports $P_M51$ and $P_M52$ of the high frequency switch module 10 through a SAW filter 151 of the SAW duplexer 15. The balanced-type high frequency external input-output ports $P_M51$ and $P_M52$ are connected to a third receiver circuit and output a third reception signal received at the antenna ANT. The SAW filter 151 of the SAW duplexer 15 is a filter that passes only a base frequency band of the third reception signal.

The switching port $P_{IC}4$ of the switch IC 11 is connected to the balanced-type high frequency external input-output ports $P_M61$ and $P_M62$ of the high frequency switch module 10 through a SAW filter 152 of the SAW duplexer 15. The balanced-type high frequency external input-output ports $P_M61$ and $P_M62$ are connected to a fourth receiver circuit and output a fourth reception signal received at the antenna ANT. The SAW filter 152 of the SAW duplexer 15 is a filter that passes only a base frequency band of the fourth reception signal.

The switching port $P_{IC}5$ of the switch IC 11 is connected to the high frequency external input-output port $P_M7$ of the high frequency switch module 10 through the low-pass filter 16. The high frequency external input-output port $P_M7$ is connected to a third transmitter circuit and receives one of a fifth transmission signal and a sixth transmission signal that differ in frequency. The low-pass filter 16 is a filter configured to significantly reduce or prevent harmonics of the fifth and sixth transmission signal.

The switching port $P_{IC}6$ of the switch IC 11 is connected to the balanced-type high frequency external input-output ports $P_M81$ and $P_M82$ of the high frequency switch module 10 through a SAW filter 171 of the SAW duplexer 17. The balanced-type high frequency external input-output ports $P_M81$ and $P_M82$ are connected to a fifth receiver circuit and output a fifth reception signal received at the antenna ANT. The SAW filter 171 of the SAW duplexer 17 is a filter that passes only a base frequency band of the fifth reception signal.

The switching port $P_{IC}7$ of the switch IC 11 is connected to the balanced-type high frequency external input-output ports $P_M91$ and $P_M92$ of the high frequency switch module 10 through a SAW filter 172 of the SAW duplexer 17. The balanced-type high frequency external input-output ports $P_M91$ and $P_M92$ are connected to a sixth receiver circuit and output a sixth reception signal received at the antenna ANT. The SAW filter 172 of the SAW duplexer 17 is a filter that passes only a base frequency band of the sixth reception signal.

The drive power signal input port $P_{IC}(Vd)$ of the switch IC 11 is connected to the direct current external input port $P_M10$ of the high frequency switch module 10 through the direct current voltage conductor 24.

The control signal input port $P_{IC}(Vc1)$ of the switch IC 11 is connected to the direct current external input port $P_M11$ of the high frequency switch module 10 through the direct current voltage conductor 21.

The control signal input port $P_{IC}(Vc2)$ of the switch IC 11 is connected to the direct current external input port $P_M12$ of the high frequency switch module 10 through the direct current voltage conductor 22.

The control signal input port $P_{IC}(Vc3)$ of the switch IC 11 is connected to the direct current external input port $P_M13$ of the high frequency switch module 10 through the direct current voltage conductor 23.

Next, referring to FIG. 4, the stacking configuration of the high frequency switch module 10 is described.

The multilayer substrate 900 of the high frequency switch module 10 preferably has a rectangular or substantially rectangular shape and includes eighteen layers of insulation layers 901 to 918 that are stacked on one another such that their principle planes are parallel or substantially parallel to each other.

Mount lands configured to mount the switch IC 11, the SAW duplexers 13, 15, and 17, and other components are provided on a surface of the topmost insulation layer 901 of the multilayer substrate 900, that is, the top plane of the multilayer substrate 900. When providing these mount lands, mount lands configured to mount the drive power signal input port $P_{IC}(Vd)$ and the control signal input ports $P_{IC}(Vc1)$, $P_{IC}(Vc2)$, and $P_{IC}(Vc3)$ of the foregoing switch IC 11 are also provided in a predetermined arrangement pattern as illustrated in FIG. 4.

On a surface of the second insulation layer 902, portions of the direct current voltage conductors 21, 22, 23, and 24 are provided. The direct current voltage conductor 21 of the insulation layer 902 is connected to the mount land of the control signal input port $P_{IC}(Vc1)$ as well as to the direct current voltage conductor 21 of the insulation layer 905 through the conductive via-hole.

An end portion of the direct current voltage conductor 22 of the insulation layer 902 is connected to the mount land of the control signal input port $P_{IC}(Vc2)$ through the conductive via-hole. The other end portion of the direct current voltage conductor 22 of the insulation layer 902 is connected to the direct current voltage conductor 22 of the insulation layer 904.

An end portion of the direct current voltage conductor 23 of the insulation layer 902 is connected to the mount land of the control signal input port $P_{IC}(Vc3)$ through the conductive via-hole. The other end portion of the direct current voltage conductor 23 of the insulation layer 902 is connected to the direct current voltage conductor 23 of the insulation layer 903.

An end portion of the direct current voltage conductor 24 of the insulation layer 902 is connected to the mount land of the drive power signal input port $P_{IC}$(Vd) through the conductive via-hole. The other end portion of the direct current voltage conductor 24 of the insulation layer 902 is connected to the external mount land for the direct current external input port $P_M$10 formed on the bottom plane of the multilayer substrate 900 through the conductive via-hole VH244.

The direct current voltage conductor 24 of the insulation layer 902 is arranged so as to extend along one side that is closest to the switch IC 11 when the multilayer substrate 900 is viewed in the stacking direction. Further, the direct current voltage conductor 24 of the insulation layer 902 is arranged so as to be close to that side.

On a surface of the third insulation layer 903, a portion of the direct current voltage conductor 23 is provided. An end portion of the direct current voltage conductor 23 of the insulation layer 903 is connected to the other end portion of the direct current voltage conductor 23 of the insulation layer 902 through the conductive via-hole. The other end portion of the direct current voltage conductor 23 of the insulation layer 903 is connected to the external mount land for the direct current external input port $P_M$13 provided on the bottom plane of the multilayer substrate 900 through the conductive via-hole VH243.

The direct current voltage conductor 23 of the insulation layer 903 is provided so as to extend along one side that is closest to the switch IC 11 when the multilayer substrate 900 is viewed in the stacking direction. Further, the direct current voltage conductor 23 of the insulation layer 903 is arranged so as to be close to that side.

On a surface of the fourth insulation layer 904, a portion of the direct current voltage conductor 22 is provided. An end portion of the direct current voltage conductor 22 of the insulation layer 904 is connected to the other end portion of the direct current voltage conductor 22 of the insulation layer 902 through the conductive via-hole. The other end portion of the direct current voltage conductor 22 of the insulation layer 904 is connected to the external mount land for the direct current external input port $P_M$12 provided on the bottom plane of the multilayer substrate 900 through the conductive via-hole VH242.

The direct current voltage conductor 22 of the insulation layer 904 is arranged so as to extend along one side that is closest to the switch IC 11 when the multilayer substrate 900 is viewed in the stacking direction. Further, the direct current voltage conductor 22 of the insulation layer 904 is arranged so as to be close to that side.

On a surface of the fifth insulation layer 905, a portion of the direct current voltage conductor 21 is provided. An end portion of the direct current voltage conductor 21 of the insulation layer 905 is connected to the other end portion of the direct current voltage conductor 21 of the insulation layer 902 through the conductive via-hole. The other end portion of the direct current voltage conductor 21 of the insulation layer 905 is connected to the external mount land for the direct current external input port $P_M$11 provided on the bottom plane of the multilayer substrate 900 through the conductive via-hole VH241.

The direct current voltage conductor 21 of the insulation layer 905 is arranged so as to extend along one side that is closest to the switch IC 11 when the multilayer substrate 900 is viewed in the stacking direction. Further, the direct current voltage conductor 21 of the insulation layer 905 is arranged so as to be close to that side.

On a surface of the sixth insulation layer 906, an in-layer ground electrode IEGND is provided. The in-layer ground electrode IEGND is provided so as to cover substantially the entire area of the insulation layer 906. On a surface of the seventh insulation layer 907, in-layer capacitor electrodes IEC are provided. On a surface of the eighth insulation layer 908, only the conductive via-holes are provided.

From the ninth insulation layer 909 to the thirteenth insulation layer 913, in-layer inductance electrodes IEL are provided. On a surface of the fourteenth insulation layer 914, only the conductive via-holes are provided.

On the fifteenth insulation layer 915 and the sixteenth insulation layer 916, in-layer capacitance electrodes IEC are provided. On a surface of the seventeenth insulation layer 917, an in-layer ground electrode IEGND is provided. The in-layer ground electrode IEGND is provided so as to cover substantially the entire area of the insulation layer 917.

On a back plane of the bottommost insulation layer 918, that is, on the bottom plane of the multilayer substrate 900, external mount lands for the direct current external input port $P_M$10, $P_M$11, $P_M$12, and $P_M$13, mount lands PGND for external ground, and respective external mount lands of the high frequency external input-output ports are provided and arranged in a predetermined pattern.

The foregoing stacking configuration enables portions of the direct current voltage conductors 21, 22, 23, and 24 to overlap each other in the stacking direction of the multilayer substrate 900. This enables, as described above, a group of the conductors (direct current voltage conductor group) configured to apply the drive power signal Vd and the control signals Vc1, Vc2, and Vc3 to the switch IC 11 to be arranged in planes viewed along the stacking direction of the multilayer substrate 900.

Further, as illustrated in the foregoing stacking diagram, formation areas of the direct current voltage conductors 21, 22, 23, and 24 may also be arranged in the stacking direction by sequentially arranging each one of the direct current voltage conductors 21, 22, 23, and 24 on the adjacent insulation layers. This improves flexibility in routing the high frequency transmission conductors inside the multilayer substrate 900.

Further, as illustrated in the foregoing stacking diagram, the direct current voltage conductors 21, 22, 23, and 24 that overlap in the stacking direction are arranged near one side of the multilayer substrate 900. This leaves an area in a center area of the multilayer substrate 900 to route the high frequency transmission conductors. This improves flexibility in routing the high frequency transmission conductors and flexibility in arranging the mount-type devices on the top plane of the multilayer substrate 900.

Figure 5A:
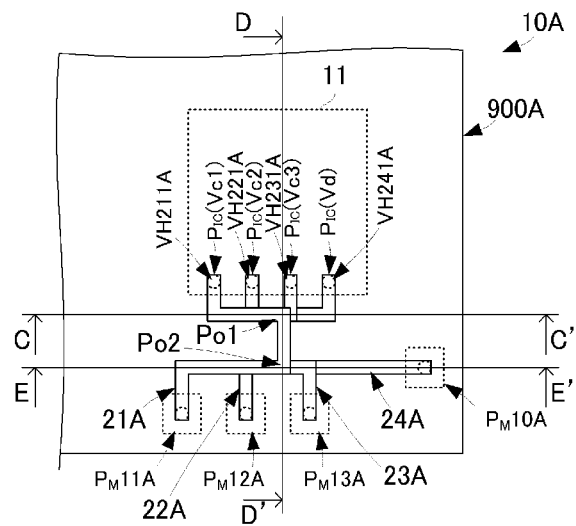
FIG. 5A to FIG. 5D are diagrams illustrating wiring pattern concepts of a high frequency switch module 10A according to a second preferred embodiment of the present invention.
Figure 5B:
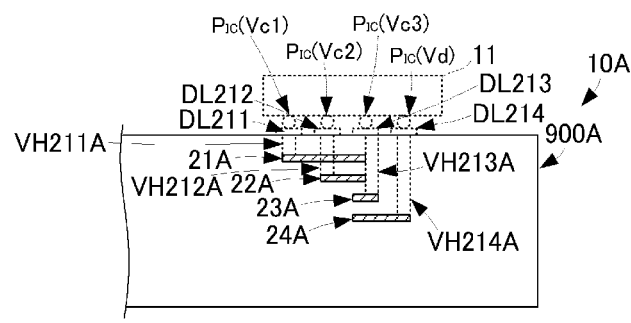
Figure 5C:
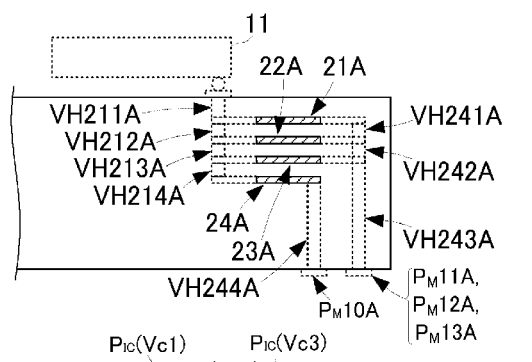
Figure 5D:
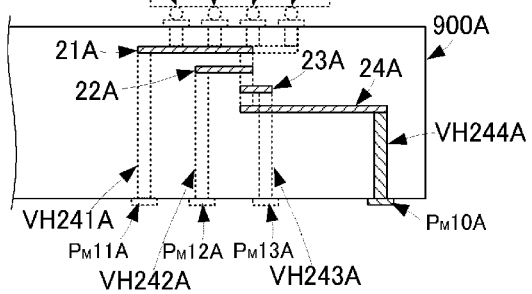

Next, a high frequency switch module according to a second preferred embodiment of the present invention is described with reference to the drawings. FIGS. 5A to 5D include diagrams illustrating wiring pattern concepts of a high frequency switch module 10A according to the second preferred embodiment. FIG. 5A is a transparent plan view, FIG. 5B is a C-C' cross-sectional diagram of FIG. 5A, FIG. 5C is a D-D' cross-sectional diagram of FIG. 5A, and FIG. 5D is an E-E' cross-sectional diagram of FIG. 5A.

The high frequency switch module 10A of the second preferred embodiment and the high frequency switch module 10 illustrated in the first preferred embodiment differ in the arrangement pattern of external mount lands for direct current external input ports $P_M$10A, $P_M$11A, $P_M$12A, $P_M$13A of a multilayer substrate 900A and differ in the mounting mode of the switch IC 11 on the top plane of the multilayer substrate 900A.

The switch IC 11 is mounted on the top plane of the multilayer substrate 900A such that the direct current voltage input side is parallel or substantially parallel to a side along which the external mount lands for the direct current external input ports $P_M$11A, $P_M$12A, and $P_M$13A of the multilayer substrate 900A are arranged. Note that the direct current external input port $P_M10A$ is provided on a side perpendicular or substantially perpendicular to the side along which the external mount lands for the direct current external input ports $P_M11A$, $P_M12A$, and $P_M13A$ are arranged.

First partial conductors corresponding to predetermined portions of the direct current voltage conductors 21A, 22A, 23A, and 24A on a connecting side to the switch IC 11 are provided and configured to extend in the direction perpendicular or substantially perpendicular to the direct current voltage input side when the multilayer substrate 900A is viewed in the stacking direction. The first partial conductors of the direct current voltage conductors 21A, 22A, 23A, and 24A have the same or substantially the same length. An end portion of the first partial conductor of the direct current voltage conductor 21A is connected to the mount land DL211 through a conductive via-hole VH211A. An end portion of the first partial conductor of the direct current voltage conductor 22A is connected to the mount land DL212 through a conductive via-hole VH212A. An end portion of the first partial conductor of the direct current voltage conductor 23A is connected to the mount land DL213 through a conductive via-hole VH213A. An end portion of the first partial conductor of the direct current voltage conductor 24A is connected to the mount land DL214 through a conductive via-hole VH214A.

Portions extending further beyond the other end portions of the first partial conductors of the direct current voltage conductors 21A, 22A, 23A, and 24A extend in a direction perpendicular or substantially perpendicular to the first partial portions. These portions are arranged so as to be concentrated at a first fork Po1 when the multilayer substrate 900A is viewed in the stacking direction. Here, the direct current voltage conductors 21A, 22A, 23A, and 24A are arranged to be separated from each other by a predetermined distance (for example, by single insulation layer) in the stacking direction.

Portions extending further beyond the first fork Po1 in the direct current voltage conductors 21A, 22A, 23A, and 24A are arranged to extend to a second fork Po2 in a direction perpendicular or substantially perpendicular to the direct current voltage input side of the switch IC 11. Compared to the first fork Po1, the second fork Po2 is disposed at a location closer to the side along which the external mount lands for the direct current external input ports $P_M11A$, $P_M12A$, and $P_M13A$ in the multilayer substrate 900A are arranged.

A portion extending further beyond the second fork Po2 in the direct current voltage conductor 21A is routed arbitrary and connected to the external mount land for the direct current external input port $P_M11A$ through a conductive via-hole VH241A. A portion extending further beyond the second fork Po2 in the direct current voltage conductor 22A is routed arbitrary and connected to the external mount land for the direct current external input port $P_M12A$ through a conductive via-hole VH242A. A portion extending further beyond the second fork Po2 in the direct current voltage conductor 23A is routed arbitrary and connected to the external mount land for the direct current external input port $P_M13A$ through a conductive via-hole VH243A. A portion extending further beyond the second fork Po2 in the direct current voltage conductor 24A is routed arbitrary and connected to the external mount land for the direct current external input port $P_M14A$ through a conductive via-hole VH244A.

Having the foregoing configuration enables further the group of the conductors (direct current voltage conductor group) configured to apply the drive power signal Vd and the control signals Vc1, Vc2, and Vc3 to the switch IC 11 to be further arranged in planes viewed along the stacking direction of the multilayer substrate 900A.

Figure 6A:
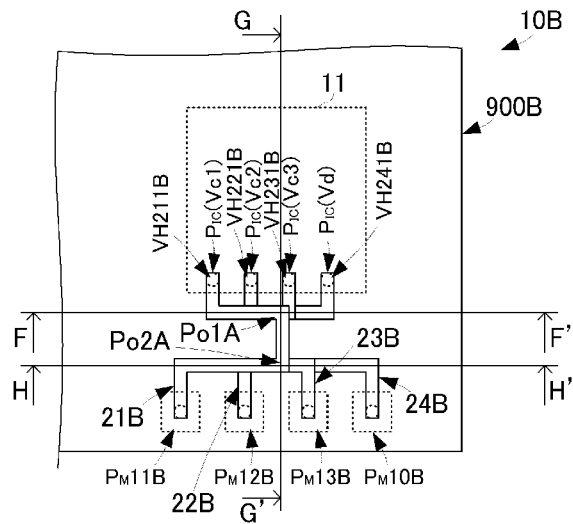
FIG. 6A to FIG. 6D are diagrams illustrating wiring pattern concepts of a high frequency switch module 10B according to a third preferred embodiment of the present invention.
Figure 6B:
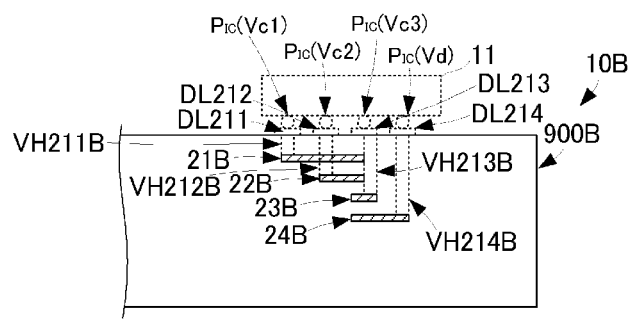
Figure 6C:
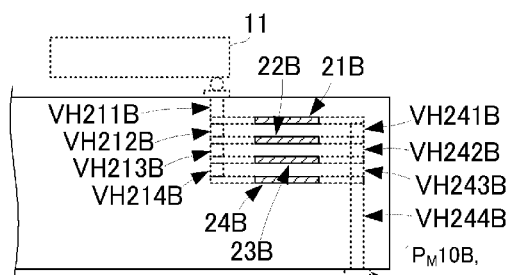
Figure 6D:
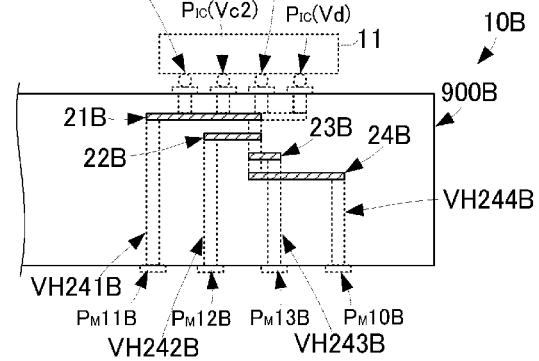

Next, a high frequency switch module according to a third preferred embodiment of the present invention is described with reference to the drawings. FIGS. 6A to 6D include diagrams illustrating wiring pattern concepts of a high frequency switch module 10B according to a third preferred embodiment. FIG. 6A is a transparent plan view, FIG. 6B is a F-F' cross-sectional diagram of FIG. 6A, FIG. 6C is a G-G' cross-sectional diagram of FIG. 6A, and FIG. 6D is a H-H' cross-sectional diagram of FIG. 6A.

The high frequency switch module 10B of the third preferred embodiment and the high frequency switch module 10A illustrated in the second preferred embodiment differ in the arrangement pattern of external mount lands for direct current external input ports $P_M10B$, $P_M11B$, $P_M12B$, $P_M13B$ of a multilayer substrate 900B and differ in the mounting mode of the switch IC 11 on the top plane of the multilayer substrate 900B.

The switch IC 11 is mounted on the top plane of the multilayer substrate 900B such that the direct current voltage input side is parallel or substantially parallel to a side along which the external mount lands for the direct current external input ports $P_M10B$, $P_M11B$, $P_M12B$, and $P_M13B$ of the multilayer substrate 900B are arranged. Here, the switch IC 11 is mounted at a location such that a distance between the direct current voltage input side and the side along which the external mount lands for the direct current external input ports $P_M10B$, $P_M11B$, $P_M12B$, and $P_M13B$ of the multilayer substrate 900B are arranged is shorter than the distance with any other side of the multilayer substrate 900B.

First partial conductors corresponding to predetermined portions of the direct current voltage conductors 21B, 22B, 23B, and 24B on the connecting side to the switch IC 11 are arranged to extend in the direction perpendicular or substantially perpendicular to the direct current voltage input side when the multilayer substrate 900B is viewed in the stacking direction. The first partial conductors of the direct current voltage conductors 21B, 22B, 23B, and 24B have the same or substantially the same length. An end portion of the first partial conductor of the direct current voltage conductor 21B is connected to the mount land DL211 through a conductive via-hole VH211B. An end portion of the first partial conductor of the direct current voltage conductor 22B is connected to the mount land DL212 through a conductive via-hole VH212B. An end portion of the first partial conductor of the direct current voltage conductor 23B is connected to the mount land DL213 through a conductive via-hole VH213B. An end portion of the first partial conductor of the direct current voltage conductor 24B is connected to the mount land DL214 through a conductive via-hole VH214B.

Portions extending further beyond the other end portions of the first partial conductors of the direct current voltage conductors 21B, 22B, 23B, and 24B are arranged to extend in a direction perpendicular or substantially perpendicular to the first partial portions. These portions are arranged to be concentrated at a first fork Po1A when the multilayer substrate 900B is viewed in the stacking direction. Here, the direct current voltage conductors 21B, 22B, 23B, and 24B are arranged to be separated from each other by a predetermined distance (for example, by single insulation layer) in the stacking direction.

Portions extending further beyond the first fork Po1 in the direct current voltage conductors 21B, 22B, 23B, and 24B extend up to a second fork Po2A in the direction perpendicular or substantially perpendicular to the direct current voltage input side of the switch IC 11. Compared to the first fork Po1, the second fork Po2A is disposed at a location closer to the side along which the external mount lands for the direct current external input ports $P_M10B$, $P_M11B$, $P_M12B$, and $P_M13B$ in the multilayer substrate 900B are arranged.

A portion extending further beyond the second fork Po2A in the direct current voltage conductor 21B is routed arbitrary and connected to the external mount land for the direct current external input port $P_M11B$ through a conductive via-hole VH241B. A portion extending further beyond the second fork Po2A in the direct current voltage conductor 22B is routed arbitrary and connected to the external mount land for the direct current external input port $P_M12B$ through a conductive via-hole VH242B. A portion extending further beyond the second fork Po2A in the direct current voltage conductor 23B is routed arbitrary and connected to the external mount land for the direct current external input port $P_M13B$ through a conductive via-hole VH243B. A portion extending further beyond the second fork Po2A in the direct current voltage conductor 24B is routed arbitrary and connected to the external mount land for the direct current external input port $P_M14B$ through a conductive via-hole VH244B.

The foregoing configuration enables the group of the conductors (direct current voltage conductor group) configured to apply the drive power signal Vd and the control signals Vc1, Vc2, and Vc3 to the switch IC 11 to be further arranged in planes viewed along the stacking direction of the multilayer substrate 900B compared with the configurations of the foregoing preferred embodiments.

In the foregoing preferred embodiments, the examples are described using the high frequency switch module with single switch IC. However, the foregoing configurations may also be applicable to high frequency switch modules with a plurality of switch ICs.

Figure 7:
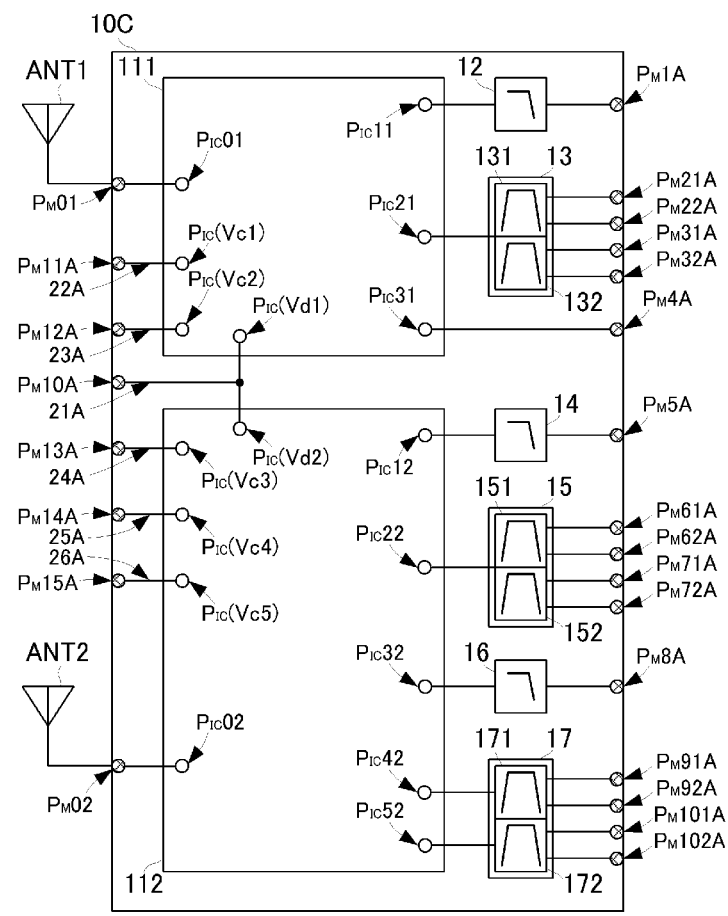
FIG. 7 is a circuit diagram of a high frequency switch module 10C that includes two switch ICs.

FIG. 7 is a circuit diagram of a high frequency switch module 10C that includes two switch ICs.

The high frequency switch module 10C includes switch ICs 111 and 112, low-pass filters 12, 14, and 16, and SAW duplexers 13, 15, and 17. The high frequency switch module 10C includes direct current external input ports $P_M10A$, $P_M11A$, $P_M12A$, $P_M13A$, $P_M14A$, and $P_M15A$, high frequency external input-output ports $P_M01$, $P_M02$, $P_M1A$, $P_M21A$, $P_M22A$, $P_M31A$, $P_M32A$, $P_M5A$, $P_M61A$, $P_M62A$, $P_M71A$, $P_M72A$, $P_M8A$, $P_M91A$, $P_M92A$, $P_M101A$, and $P_M102A$, and a terminal port $P_M4A$.

The switch IC 111 includes a drive power signal input port $P_{IC}(Vd1)$, control signal input ports $P_{IC}(Vc1)$ and $P_{IC}(Vc2)$, a common port $P_{IC}01$, and a plurality of switching ports $P_{IC}11$, $P_{IC}21$, and $P_{IC}31$. The common port $P_{IC}01$ and the plurality of switching ports $P_{IC}11$ and $P_{IC}21$ are ports configured to input and output high frequency signals that define various communication signals. The switching port $P_{IC}31$ is a terminal connection port.

The switch IC 111 is activated by the drive voltage at a predetermined level supplied from the drive power signal input port $P_{IC}(Vd1)$, and connects the common port $P_{IC}01$ and one of the plurality of switching ports $P_{IC}11$, $P_{IC}21$, and $P_{IC}31$ according to a combination of voltage levels (Hi, Low) of the control signal input ports $P_{IC}(Vc1)$ and $P_{IC}(Vc2)$.

The common port $P_{IC}01$ of the switch IC 111 is connected to the high frequency external input-output port $P_M01$ of the high frequency switch module 10C, and this high frequency external input-output port $P_M01$ is connected to an antenna ANT1.

The switching port $P_{IC}11$ of the switch IC 111 is connected to the high frequency external input-output port $P_M1A$ of the high frequency switch module 10C through the low-pass filter 12.

The switching port $P_{IC}21$ of the switch IC 111 is connected to the balanced-type high frequency external input-output ports $P_M21A$ and $P_M22A$ of the high frequency switch module 10C through a SAW filter 131 of the SAW duplexer 13. The switching port $P_{IC}21$ of the switch IC 111 is connected to the balanced-type high frequency external input-output ports $P_M31A$ and $P_M32A$ of the high frequency switch module 10C through a SAW filter 132 of the SAW duplexer 13.

The switching port $P_{IC}31$ of the switch IC 111 is connected to the terminal port $P_M4A$ of the high frequency switch module 10C.

The drive power signal input port $P_{IC}(Vd1)$ of the switch IC 111 is connected to the direct current external input port $P_M10A$ of the high frequency switch module 10C through the direct current voltage conductor 21A.

The control signal input port $P_{IC}(Vc1)$ of the switch IC 111 is connected to the direct current external input port $P_M11A$ of the high frequency switch module 10C through the direct current voltage conductor 22A.

The control signal input port $P_{IC}(Vc2)$ of the switch IC 111 is connected to the direct current external input port $P_M12A$ of the high frequency switch module 10C through the direct current voltage conductor 23A.

The switch IC 112 includes a drive power signal input port $P_{IC}(Vd2)$, control signal input ports $P_{IC}(Vc3)$, $P_{IC}(Vc4)$, and $P_{IC}(Vc5)$, a common port $P_{IC}02$, and a plurality of switching ports $P_{IC}12$, $P_{IC}22$, $P_{IC}32$, $P_{IC}42$, and $P_{IC}52$. The common port $P_{IC}02$ and the plurality of switching ports $P_{IC}12$, $P_{IC}22$, $P_{IC}32$, $P_{IC}42$, and $P_{IC}52$ are ports configured to input and output high frequency signals that serve as various communication signals.

The switch IC 112 is activated by the drive voltage at a predetermined level supplied from the drive power signal input port $P_{IC}(Vd2)$, and connects the common port $P_{IC}02$ and one of the plurality of switching ports $P_{IC}12$, $P_{IC}22$, $P_{IC}32$, $P_{IC}42$, and $P_{IC}52$ according to a combination of voltage levels (Hi, Low) of the control signal input ports $P_{IC}(Vc3)$, $P_{IC}(Vc4)$, and $P_{IC}(Vc5)$.

The common port $P_{IC}02$ of the switch IC 112 is connected to the high frequency external input-output port $P_M02$ of the high frequency switch module 10C, and this high frequency external input-output port $P_M02$ is connected to an antenna ANT2.

The switching port $P_{IC}12$ of the switch IC 112 is connected to the high frequency external input-output port $P_M5A$ of the high frequency switch module 10C through the low-pass filter 14.

The switching port $P_{IC}22$ of the switch IC 112 is connected to the balanced-type high frequency external input-output ports $P_M61A$ and $P_M62A$ of the high frequency switch module 10C through a SAW filter 151 of the SAW duplexer 15.

The switching port $P_{IC}22$ of the switch IC 112 is connected to the balanced-type high frequency external input-output ports $P_M71A$ and $P_M72A$ of the high frequency switch module 10C through a SAW filter 152 of the SAW duplexer 15.

The switching port $P_{IC}32$ of the switch IC 112 is connected to the high frequency external input-output port $P_M8A$ of the high frequency switch module 10C through the low-pass filter 16.

The switching port $P_{IC}42$ of the switch IC 112 is connected to the balanced-type high frequency external input-output ports $P_M91A$ and $P_M92A$ of the high frequency switch module 10C through a SAW filter 171 of the SAW duplexer 17.

The switching port $P_{IC}52$ of the switch IC 112 is connected to the balanced-type high frequency external input-output ports $P_M101A$ and $P_M102A$ of the high frequency switch module 10C through a SAW filter 172 of the SAW duplexer 17.

The drive power signal input port $P_{IC}(Vd2)$ of the switch IC 112 is connected to the direct current external input port $P_M10A$ of the high frequency switch module 10C through the direct current voltage conductor 21A. In other words, the drive power signal input ports $P_{IC}(Vd1)$ and $P_{IC}(Vd2)$ of the switch IC 112 and 112 are connected to the common direct current external input port $P_M10A$ of the high frequency switch module 10C through the direct current voltage conductor 21A.

The control signal input port $P_{IC}(Vc3)$ of the switch IC 112 is connected to the direct current external input port $P_M13A$ of the high frequency switch module 10C through the direct current voltage conductor 24A.

The control signal input port $P_{IC}(Vc4)$ of the switch IC 112 is connected to the direct current external input port $P_M14A$ of the high frequency switch module 10C through the direct current voltage conductor 25A.

The control signal input port $P_{IC}(Vc5)$ of the switch IC 112 is connected to the direct current external input port $P_M15A$ of the high frequency switch module 10C through the direct current voltage conductor 26A.

As is the case with the foregoing preferred embodiments, the high frequency switch module 10C having the foregoing configuration may achieve functions and effects similar to those in the foregoing preferred embodiments by arranging the direct current voltage conductors 21A, 22A, 23A, 24A, 25A, and 26A such that all the direct current voltage conductors 21A, 22A, 23A, 24A, 25A, and 26A overlap each other at least partially.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high frequency switch module comprising:
  a switch IC including:
    a common port to and from which a high frequency signal is inputted and outputted;
    a plurality of switching ports, a number of which is greater than that of the common port, each switching port being a port to and from which the high frequency signal is inputted and outputted;
    a drive power supply port to which a drive power signal is inputted; and
    a plurality of control ports to which control signals are inputted, the control signals being signals to determine a connection state between the common port and the plurality of switching ports; and
  a multilayer substrate on which the switch IC is mounted and including:
    a high frequency transmission conductor configured to transmit the high frequency signal;
    a plurality of direct current voltage conductors through which the drive power signal and the control signals are transmitted respectively
    a plurality of direct current external input ports to which the drive power signal and the control signals are inputted respectively; and
    a plurality of high frequency external input-output ports, each of which being a port to and from which the high frequency signal is inputted and outputted; wherein
    the plurality of direct current voltage conductors are all arranged so that in-layer conductors of the plurality of direct current voltage conductors overlap each other at least partially along the multilayer substrate, the in-layer conductors being routed inside a plane perpendicular or substantially perpendicular to a stacking direction of the plurality of direct current voltage conductors.

2. The high frequency switch module according to claim 1, wherein
  first partial conductors of the plurality of direct current voltage conductors on a connecting side to the drive power supply port and the plurality of control ports of the switch IC are arranged to be concentrated at a first fork in a state in which the multilayer substrate is viewed in a direction parallel to the stacking direction; and
  the in-layer conductors of the plurality of direct current voltage conductors between the first fork and the direct current external input ports of the multilayer substrate are arranged so that the in-layer conductors overlap each other at least partially along the multilayer substrate.

3. The high frequency switch module according to claim 2, wherein
  second partial conductors of the plurality of direct current voltage conductors on a connecting side to the direct current external input ports of the multilayer substrate are arranged to be concentrated at a second fork in the state where the multilayer substrate is viewed in a direction parallel to the stacking direction, the second fork being separated from the first fork, and
  the in-layer conductors of the plurality of direct current voltage conductors between the first fork and the second fork are arranged so that all of the in-layer conductors overlap each other along the multilayer substrate.

4. The high frequency switch module according to claim 1, wherein the in-layer conductors of each one of the plurality of direct current voltage conductors are provided in adjacent insulation layers of a plurality of insulation layers that define the multilayer substrate.

5. The high frequency switch module according to claim 1, wherein
  a chassis of the switch IC and a chassis of the multilayer substrate have rectangular or substantially rectangular shapes;
  the drive power supply port and the plurality of control ports of the switch IC are arranged near and along a first side of the chassis of the switch IC;
  the plurality of direct current external input ports of the multilayer substrate are arranged near and along a second side of the chassis of the multilayer substrate; and
  the switch IC is mounted on the multilayer substrate so that the first side of the switch IC and the second side of the multilayer substrate are parallel or substantially parallel to each other and so that the second side is closer to the first side than other sides of the multilayer substrate.

6. The high frequency switch module according to claim 1, wherein each one of the plurality of direct current voltage conductors is connected to a respective one of the plurality of direct current external input ports through a conductive via-hole.

7. The high frequency switch module according to claim 6, wherein each of the conductive via-holes has a different length.

8. The high frequency switch module according to claim 1, wherein each one of the plurality of direct current voltage conductors has an L shape.

9. The high frequency switch module according to claim 1, wherein the multilayer substrate include a plurality of insulating layers that are stacked on one another in a stacking direction.

10. The high frequency switch module according to claim 9, wherein the in-layer conductors of the plurality of direct current voltage conductors are each provided on a different one of the plurality of insulating layers.

11. The high frequency switch module according to claim 1, further comprising an insulating resin disposed on a main surface of the multilayer substrate.

12. The high frequency switch module according to claim 11, wherein the insulating resin is arranged to cover the switch IC.

13. The high frequency switch module according to claim 1, further comprising surface acoustic wave duplexers mounted on the multilayer substrate.

14. The high frequency switch module according to claim 1, wherein the multilayer substrate includes land electrodes on a top main surface of the multilayer substrate on which the switch IC is mounted, and external mount land electrodes on a bottom main surface of the multilayer substrate arranged to mount the multilayer substrate on a circuit board.

* * * * *